United States Patent [19]

Sakai et al.

[11] Patent Number: 4,812,201

[45] Date of Patent: Mar. 14, 1989

[54] METHOD OF ASHING LAYERS, AND APPARATUS FOR ASHING LAYERS

[75] Inventors: Hiroyuki Sakai; Kazutoshi Yoshioka; Kimiharu Matsumura; Keisuke Shigaki, all of Kumamoto; Yutaka Amemiya, Yamanashi; Shunichi Iimuro, Yamanashi; Haruhiko Yoshioka, Yamanashi; Teruhiko Onoe, Kofu, all of Japan

[73] Assignee: Tokyo Electron Limited, Tokyo, Japan

[21] Appl. No.: 73,978

[22] Filed: Jul. 15, 1987

[30] Foreign Application Priority Data

| Jul. 25, 1986 | [JP] | Japan | 61-175141 |
| Jul. 25, 1986 | [JP] | Japan | 61-175142 |
| Aug. 29, 1986 | [JP] | Japan | 61-203250 |
| Nov. 25, 1986 | [JP] | Japan | 61-280482 |
| Nov. 25, 1986 | [JP] | Japan | 61-280483 |
| Dec. 25, 1986 | [JP] | Japan | 61-314093 |

[51] Int. Cl.$^4$ .................................. H01L 21/302
[52] U.S. Cl. .................... 156/643; 156/646; 204/192.32; 430/329
[58] Field of Search ............... 156/345, 643, 646; 204/192.32; 430/328, 329, 330, 432

[56] References Cited

U.S. PATENT DOCUMENTS

| 4,201,579 | 5/1980 | Robinson et al. | 156/627 X |
| 4,296,146 | 10/1981 | Penn | 427/226 X |
| 4,341,592 | 7/1982 | Shortes et al. | 156/646 X |

Primary Examiner—David L. Lacey
Assistant Examiner—Thi Dang
Attorney, Agent, or Firm—Oblon, Fisher, Spivak, McClelland & Maier

[57] ABSTRACT

A method and an apparatus, both for ashing unnecessary layers such as a photoresist layer, formed on a semiconductor wafer, by applying ozone to the layer, are disclosed. An ashing gas containing oxygen atom radical, or containing oxygen gas and an ashing-promoting gas, is applied to the layer, thereby ashing the layer readily and efficiently. The surface temperature of the layer is set at a prescribed value, and the ashing gas is applied uniformly onto the entire surface of the layer, or onto a part thereof, thus ashing the whole layer, or a part thereof, uniformly at a high rate, and the end-point of the ashing process is detected, thereby to enhance the efficiency of the ashing process.

4 Claims, 13 Drawing Sheets

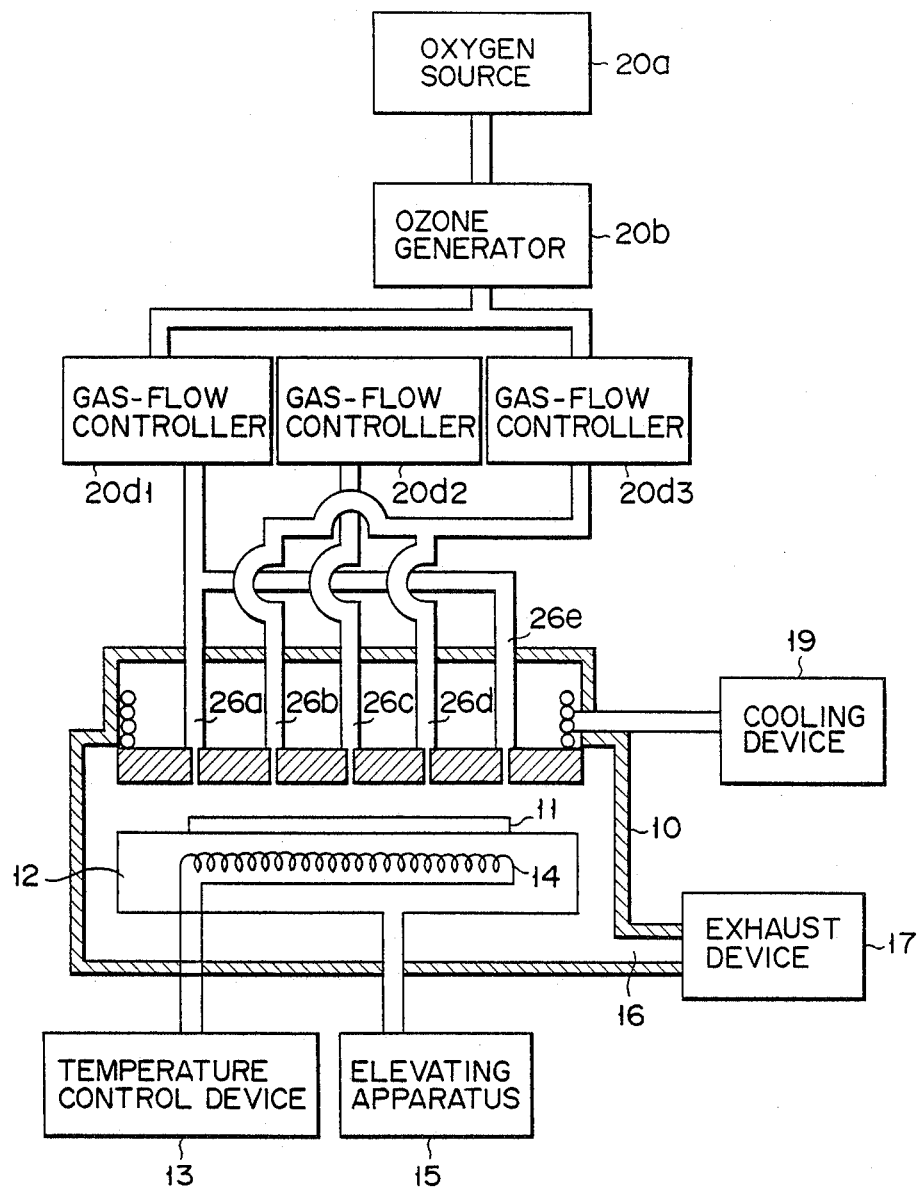
F I G. 17

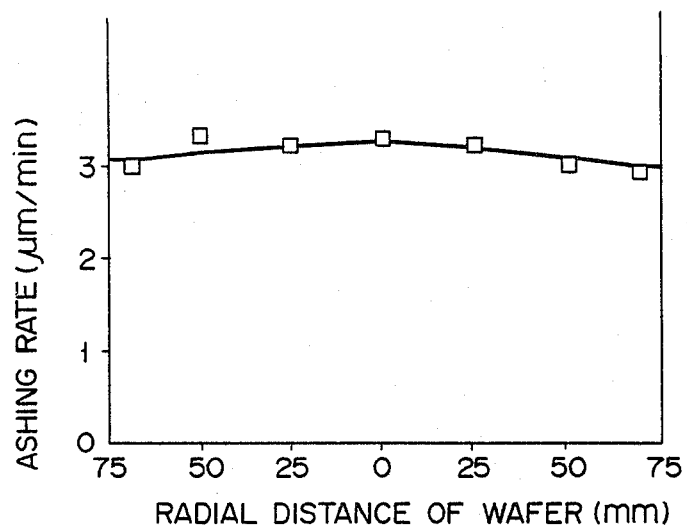
F I G. 21
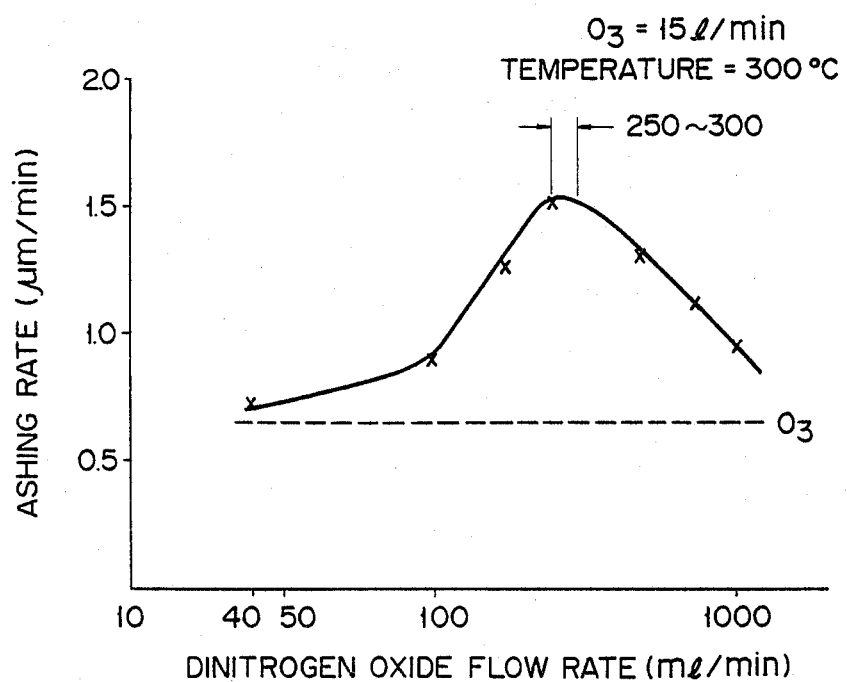
F I G. 22

METHOD OF ASHING LAYERS, AND APPARATUS FOR ASHING LAYERS

BACKGROUND OF THE INVENTION

1. Field of the Invention

The present invention relates to a method and an apparatus, both for ashing a photoresist layer or the like formed on a semiconductor wafer, by applying ozone to the layer.

2. Description of the Prior Art

The fine and complex pattern of a semiconductor IC is formed by etching a substrate formed on a semiconductor wafer, by using a photoresist layer of a high-molecular weight organic composition as an etching mask. The photoresist layer must be removed from the surface of the wafer after the etching. One of the methods for removing the photoresist layer is an ashing process. This process is used not only to remove a photoresist layer from a semiconductor wafer and clean silicon wafers and etching masks, but to remove ink or residual solvents. It is, therefore, an effective process for achieving a dry-etching required in manufacturing semiconductor devices.

Various ashing apparatuses for removing photoresist layers are known. Of these, the one using oxygen plasma is most commonly used. This ashing apparatus has an ashing chamber. It removes a photoresist layer from the surface of a semiconductor wafer in the following manner. First, the wafer is placed within the ashing chamber. Then, oxygen gas is introduced into the chamber. A high-frequency electric field is applied to the gas, thereby forming plasma. The oxygen atom radical of the plasma oxidizes the photoresist layer, thus decomposing the layer into carbon dioxide, carbon, monoxide and water, thereby removing the photoresist layer from the wafer.

However, the ashing apparatus using oxygen plasma has a drawback. Ions or electrons are present in the plasma and accelerated by the electric field. These ions or electrons are inevitably applied to the semiconductor wafer, and do damage to the wafer.

Another ashing apparatus is known which can remove a photoresist layer from a semiconductor wafer. This apparatus applies ultraviolet rays to the wafer, generating an oxygen atom radical. Hence, the apparatus can process a batch of semiconductor wafers. Certainly, the apparatus does no damage to wafers, since it uses no plasma. But its ashing rate is rather low—50 to 150 nm/min. Therefore, much time is required to remove a photoresist layer from a semiconductor wafer. In view of this, the apparatus is considered to be unfit for processing semiconductor wafers of a large diameter, one by one.

The applicants have developed an ashing technique which can remove photoresist layers from semiconductor wafers at high speed without applying ultraviolet rays to the wafers. This technique is disclosed in U.S. Patent 4,341,592. As is described in the U.S. patent, the technique uses a gas-supplying plate having a plurality of openings. The plate is positioned close to a semiconductor wafer, and an ashing gas is made to flow through the openings to the surface of the wafer. When an ashing gas containing ozone is used, the ozone must be decomposed when applied to the surface of the wafer which is maintained at high temperature, thereby to achieve a successful ashing. Therefore, in the technique, the gas-supplying plate must be cooled to prevent the ozone from being decomposed as it flows through the openings. The technique, however, has drawbacks, too. First, a great amount of deposit is formed on that surface of the wafer which opposes the gas-applying plate. This deposit is a source of dust, which will reduce the cleanness of the room in which semiconductor wafers are processed to make ICs of a high integration density. Secondly, since the gas-applying plate is closed to the wafer, the ashing gas flowing through the openings is not applied evenly onto the entire surface of the wafer. Consequently, the wafer cannot be uniformly ashed.

SUMMARY OF THE INVENTION

It is accordingly the object of this invention to provide a method and an apparatus which can ash unnecessary layers such as a photoresist layer, formed on a semiconductor wafer or the like, at a high rate without damaging the semiconductor wafer or the like.

According to the invention, there is provided an ashing method which comprises the steps of:
generating an oxygen atom radical from an ozone-containing gas by applying the gas uniformly over the surface of a substrate heated to a high temperature; and
ashing a desired portion of a layer formed on one surface of said substrate, by using the oxygen radical.

Further, according to another aspect of the present invention, there is provided an ashing apparatus for ashing a layer formed on a substrate, by applying an ozone-containing ashing gas to the layer, said apparatus comprising:
a chamber containing a table for supporting said substrate;
a nozzle provided within said chamber, located above said table, positioned coaxially with said table so as to supply the ashing gas toward said table;
gas-applying means for applying the ashing gas supplied from said nozzle uniformly onto the surface of said substrate;
gas-supplying means for supplying the ashing gas to said nozzle;
cooling means for cooling the ashing gas to a predetermined temperature; and
exhaust means connected to said chamber.

BRIEF DESCRIPTION OF THE DRAWINGS

FIG. 17 schematically shows an ashing apparatus having a plurality of nozzles for supplying an ashing gas;

FIG. 21 is a graph illustrating the relationship between the ashing rate and the radial distance of a wafer; and FIG. 22 is a graph representing the relationship between the ashing rate and the dinitrogen oxide flow rate.

DETAILED DESCRIPTION OF THE PREFERRED EMBODIMENTS

Figure 1:
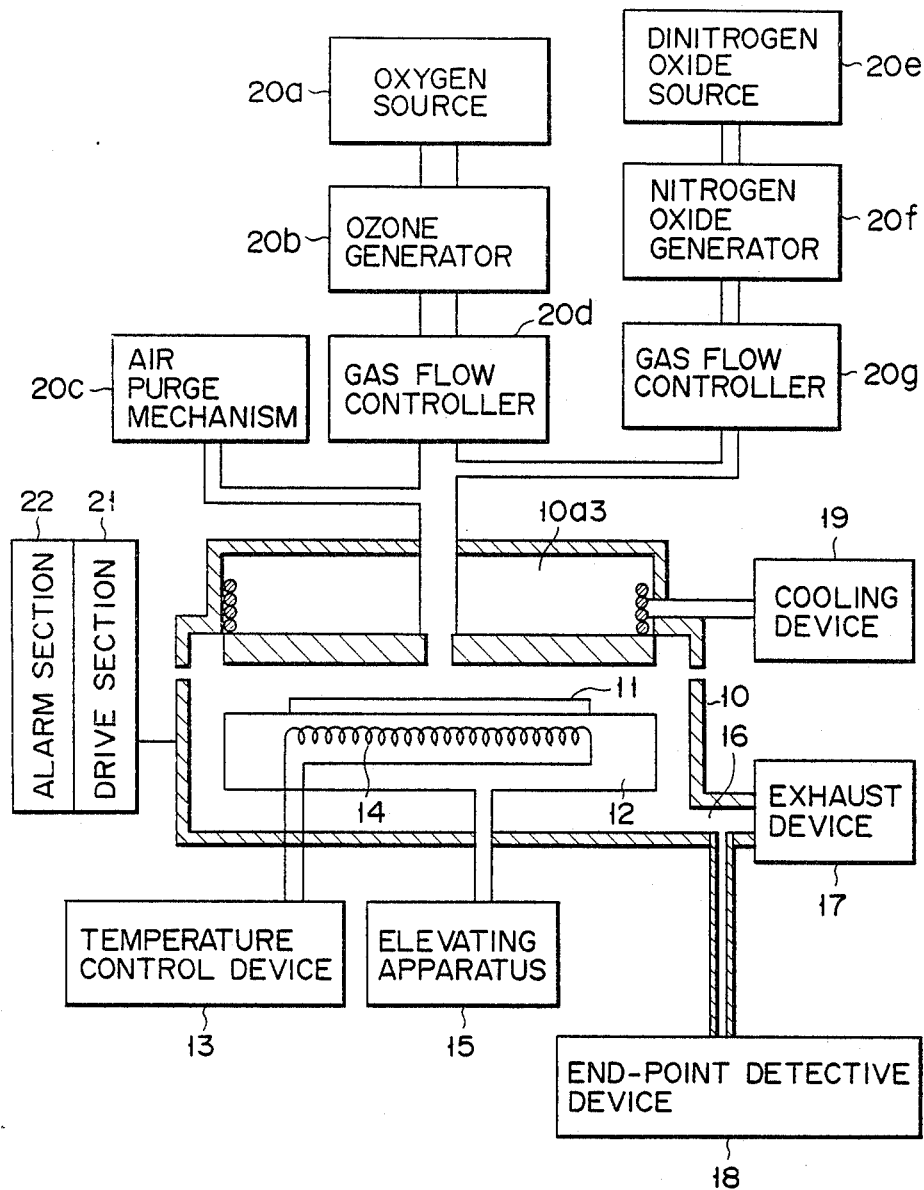
FIG. 1 schematically shows an ashing apparatus according to one embodiment of the invention, designed to process a semiconductor wafer.

The embodiments of the present invention will now be described with reference to the accompanying drawings. FIG. 1 is a diagram schematically showing an apparatus according to the invention, designed for ashing a layer formed on a semiconductor wafer. As is shown in FIG. 1, this apparatus has chamber 10. Table 12 is provided within chamber 10. Semiconductor wafer 11 is placed on table 12. Table 12 is provided with a vacuum chuck (not shown) for holding wafer 11 firmly on table 10. Table 12 has built-in heater 14 which is controlled by temperature control device 13. Table 12 can be moved up and down by elevating apparatus 15, and can be rotated at a predetermined speed by a drive device (not shown). The lower portion of chamber 10 is connected by conduit 16 to exhaust device 17 provided beside chamber 10. Exhaust device 17 is designed to exhaust gas from chamber 10 at a prescribed rate. End-point detecting device 18 is connected by a pipe to conduit 16, for receiving a part of the gas exhausted from chamber 10 and detecting the end point of the ashing performed within chamber 10. Cooling device 19 is connected to the upper portion of chamber 10 by a conduit. Gas-supplying section 20 is provided above chamber 10 and connected thereto. Gas-supplying section 20 comprises oxygen source 20a, ozone generator 20b, air-purging mechanism 20c, first gas-flow controller 20d, dinitrogen oxide source 20e, nitrogen oxide generator 20f, and second gas-flow controller 20g. Components 20a to 20g cooperate to determine the composition of the ashing gas which will be supplied to chamber 10. Air-purging mechanism 20c supplies air into chamber 10. First gas-flow controller 20d controls the flow of the gas supplied from ozone generator 20b. Second gas-flow controller 20g controls the flow of the nitrogen oxide gas supplied from nitrogen oxide generator 20f. The apparatus further comprises drive section 21 and alarm section 22. Drive section 21 is provided to control elevating apparatus 15, exhaust device 17, cooling device 19, and gas-supplying section 20. Alarm section 22 gives an alarm when any of components 15, 17, 19 and 20 malfunctions, and supplies a predetermined signal, such as a stop signal, to the malfunctioning component. Drive section 21 is designed to control wafer-supplying device 25 for supplying semiconductor wafers to the chamber. Device 25 is provided beside chamber 10.

Figure 2:
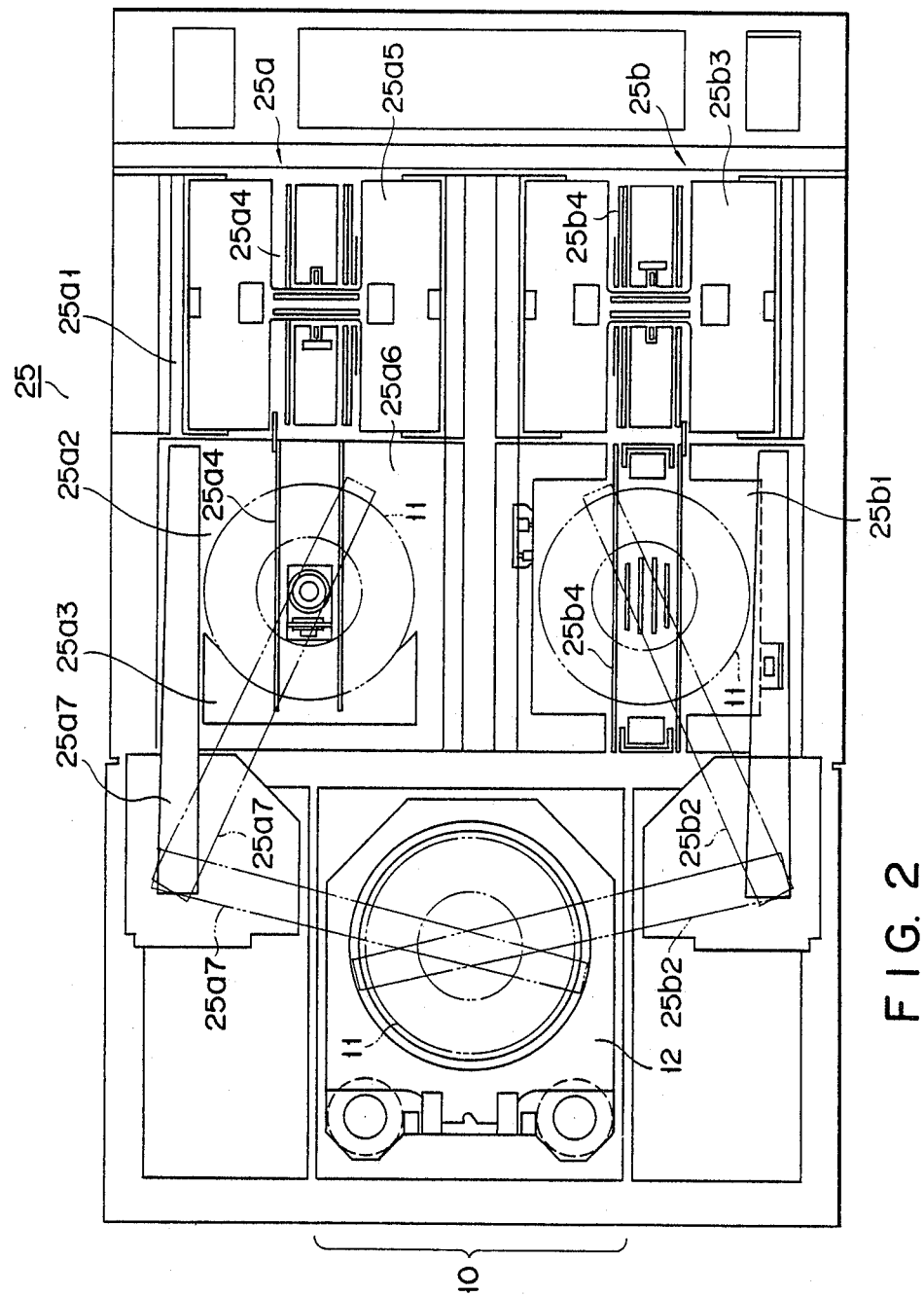
FIG. 2 is a plan view of an apparatus for supplying semiconductor wafers.

FIG. 2 is a plane view of wafer-supplying device 25. Device 25 is used to automatically supply semiconductor wafer 11 into chamber 10 and place it at a prescribed position on table 12, and to move wafer 11 out of chamber 10 after wafer 11 has been ashed. As is shown in FIG. 2, wafer-supplying device 25 comprises loader section 25a and unloader section 25b.

Loader section 25a has wafer-supplying unit 25a1 and wafer-positioning unit 25a2. Unit 25a1 receives wafer 11 from a wafer storage (not shown) and supplies wafer 11 to wafer-positioning unit 25a2. Unit 25a2 has guide 25a3 which can contact the periphery of wafer 11 supplied from wafer-supplying unit 25a1, thereby guiding wafer 11 to table 12, Guide 25a3 is made of a fluorine resin such as tetrafluoroethylene. Units 25a1 and 25a2 have bases 25a5 and 25a6, respectively. Either base, which is made of, for example, aluminum, has two straight grooves cut in at least its upper surface. A pair of endless conveyor belts 25a4 are wrapped around either base. These belts 25a4 are made of, for example, silicone rubber, and are driven, guided by grooves of the base. Those portions of belts 25a4 which are guided by the grooves are flush with the upper surface of the base.

Unloader section 25b has wafer-holding unit 25b1 and wafer-returning unit 25b3. Wafer-holding unit 25b1 is used to temporarily hold wafer 11 which has been ashed in chamber 10 and transferred therefrom. Wafer-returning unit 25b3 is provided to receive wafer 11 from unit 25b1 and return the wafer to the wafer storage (not shown). Like units 25a1 and 15a2 of loading section 25a, these units 25b1 and 15b3 each have a base. The base is made of, for example, aluminum, and has two straight grooves cut in at least its upper surface. A pair of endless conveyor belts 25b4 are wrapped around either base. These belts 25b4 are made of, for example, silicone rubber, and are driven, guided by grooves of the base. Those portions of belts 25b4 which are guided by the grooves are flush with the upper surface of the base.

Dust rises and may enter into chamber 10 when conveyor belts 25a4 and 25b4 are driven. To remove dust from chamber 10, chamber 10 may be evacuated after wafer 11 has been placed on table 12.

Figure 3:
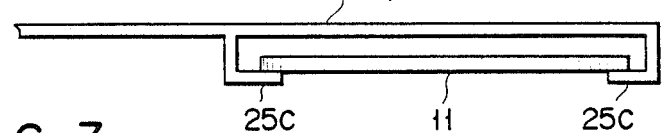
FIG. 3 is a diagram explaining how a hand arm holds a semiconductor wafer.

Two hand arms 25a7 and 25b2 provided. Hand arm 25b7 can rotate around one end located on one side of chamber 10, in order to transfer wafer 11 from wafer-positioning unit 25a2 to table 12. Hand arm 25b2 can rotate around one end located at one side of chamber 10, in order to transfer wafer 11 from table 12 to wafer-holding table 25b1. FIG. 3 is a side view of either hand arm. As is shown in this figure, hand arms 25a7 and 25b2 are provided with wafer-holding sections 25c each connected to a vacuum pump (not shown) by a passage made in the arm.

Figure 4:
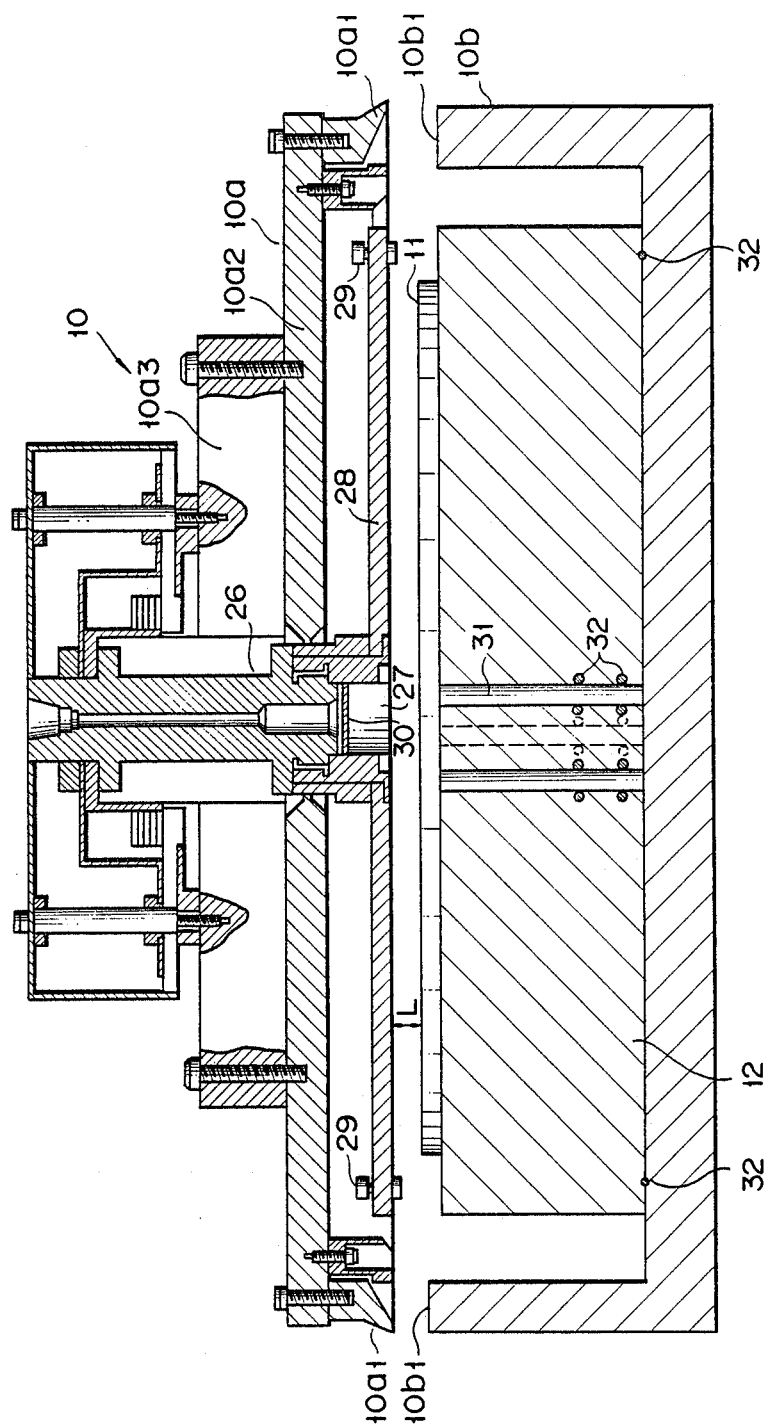
FIG. 4 is a cross-sectional view the wafer-processing chamber of the apparatus shown in FIG. 2.

FIG. 4 is a cross-sectional view of chamber 10. As is shown in this figure, chamber 10 comprises upper half 10a and lower half 10b. Halves 10a and 10b are separated so that semiconductor wafer 11 can be inserted into chamber 10. Upper half 10a comprises cover 10a2 and rim 10a1 secured to the peripheral portion of the lower surface of cover 10a2. Rim 10a1 is made of a fluorine resin. Thus, when upper half 10a and lower half 10b are fastened to each other, rim 10a1 can contract rim 10b1 of lower half 10b in an airtight fashion. A hydraulic cylinder (not shown) is provided to fasten halves 10a and 10b together and to separate them from each other.

Figure 5:
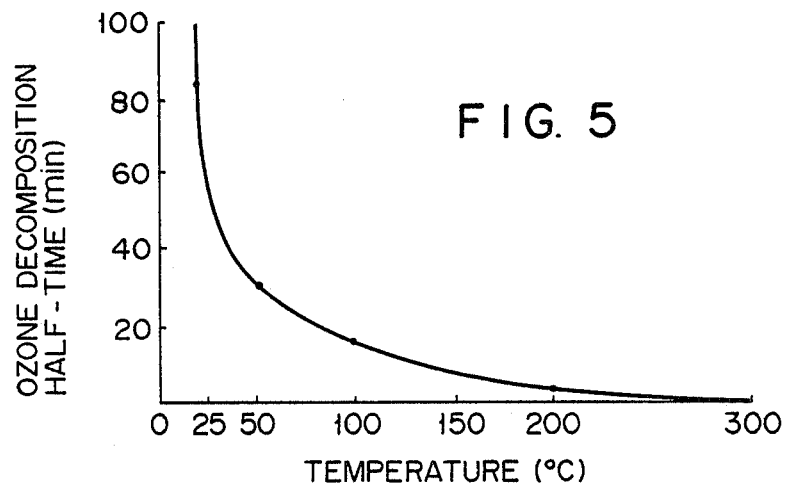
FIG. 5 is a graph illustrating the relationship between zone decomposition half-time and temperature.

As is shown in FIG. 4, cooling chamber 10a3 is provided above cover 10a2 of upper half 10a. Cooling chamber 10a3 is connected to cooling device 19, and the atmosphere within this chamber 10a3 is maintained at 15° C. or less. Cooling chamber 10a3 is used to cool nozzle 26 (later described) for supplying an ashing gas into chamber 10, thereby to prolong the lifetime of the ozone contained in the ashing gas. This is because, as is shown in FIG. 5, the lifetime of the ozone contained in oxygen gas will be greatly reduced when the temperature rises above 25° C.

Nozzle 26 extends through the center hole of upper half 10a of chamber 10 and the center hole of cooling chamber 10a3. Nozzle 26 is a hollow cylinder, and has outlet opening 27 at its distal end. Opening 27 has a diameter of 8 mm. Insulation disc 28 is attached to the distal end of nozzle 26, and positioned such that its lower surface is flush with the distal end of nozzle 26. The diameter of insulation disc 28 is slightly greater than that of semiconductor wafer 11. Disc 28 is made of material having a low thermal conductivity, such as heat-resistant glass (e.g., Pyrex) or quartz glass. Pins 29 are slidably inserted in vertical holes cut in the peripheral edge of insulation disc 28, and protrude downwardly from the lower surface of disc 28. When upper half 10a and lower half 10b are fastened together, pins 29 contact table 12, thereby providing gap L (about 0.5 mm to about 20 mm) between insulation disk 28 and wafer 11 mounted on table 12.

Figure 6A:
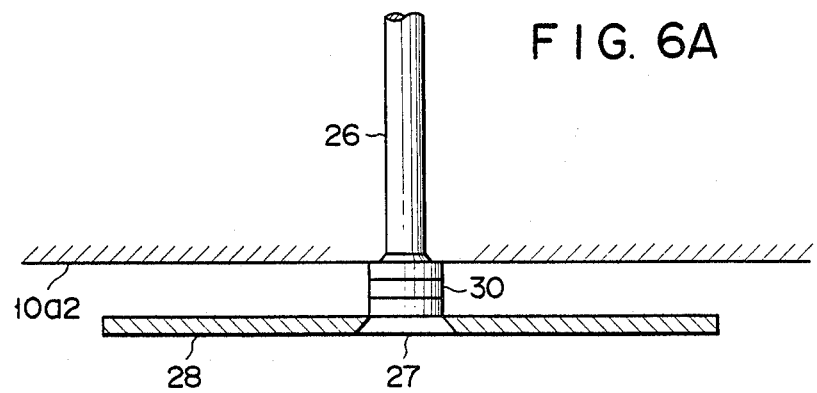
FIG. 6A is a diagram showing the positional relationship between the nozzle and the insulation plate of the apparatus shown in FIG. 1.
Figure 6B:
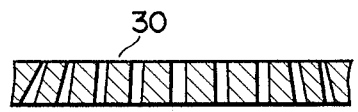
FIG. 6B is a cross-sectional showing a gas discharge disc.

Nozzle 26 is connected to gas-supplying section 20, and is preferably an aluminum tube having an inner diameter of, for example, 2 to 30 mm. When the inner diameter of nozzle 26 falls within this range, it is desired that outlet opening 27 should have a diameter ranging from 20 to 40 mm. As is shown in FIGS. 6A and 6B, gas-dispersing disk 30 is fitted in nozzle 26 and located close to outlet opening 27. Disc 30 is made of, for example, aluminum, and has a diameter of 2 to 30 mm. Gas-dispersing disc 30 has a plurality of holes having a diameter of 0.01 to 5 mm. Disc 30 is designed to disperse the ashing gas concentratedly applied to its center portion, whereby the ashing gas is applied uniformly onto the surface of semiconductor wafer 11 placed on table 12. Each of the holes of disk 30 may have an axis inclined such that the stream of the ashing gas flares toward semiconductor wafer 11. Without gas-dispersing disk 30, it would be difficult to apply the ashing gas onto wafer 11 in such a manner as to achieve uniform ashing.

Nozzle 26 is not in direct contact with cover 10a2. Seal ring 31 made of a fluorin resin such as tetrafluoroethylen is interposed between nozzle 26 and cover 10a2, and nozzle 26 is in airtight contact with cover 10a2. Cover 10a2 can slightly rotate with respect to nozzle 26 so that a uniform gap (t) is provided between wafer 11 and insulation disk 28 when upper and lower halves 10a and 10b of chamber 10 are completely fastened together.

The upper surface region of table 12 accommodated in lower half 10b is, for example, an aluminum layer. The surface of this layer has been polished by honing, then treated with oxalic acid, and finally impregnated with a fluorine resin, and is therefore unlikely to have cracks. Three elevating pins 31 are vertically provided within table 12. These pins 31 are lifted to move up wafer 11 a little from table 12 to make it easer for hand arms 25a7 and 25b2 to catch wafer 11. The lower surface region of table 12 is made of heat insulating material. Packing 32, made of stainless steel and coated with a fluorine resin, is interposed between the lower surface of table 12 and the bottom of lower half 10b, thereby ensuring an airtight contact between table 12 and pins 31, on the one hand, and the bottom of chamber 10, on the other.

The method of ashing a semiconductor wafer, which is performed by using the ashing apparatus described above, will now be explained.

First, drive section 21 is actuated, thereby supplying semiconductor wafer 11 from loader section 25a of wafer-supplying device 25 (FIG. 3) onto table 12 provided in chamber 10. A photoresist layer is formed on a specified portion of wafer 11. The photoresist layer, which will be removed from wafer 11 by ashing, is made of a novolac resin or a 0-quinon diazide resin (e.g., OFPR-800, OFPR-5000, both manufactured by Tokyo Ohka, Japan).

Then, semiconductor wafer 11 is transferred from wafer-supplying unit 25a1 to wafer-positioning unit 25a2 by conveyor belts 25a4. In wafer-positioning unit 25a2, wafer 11 undergoes centering and orientation-flat alignment. The centering of wafer 11 is accomplished by bringing the periphery of wafer 11 into contact with guide 25a3. After wafer 11 has been correctly positioned, hand arm 25a7 catches wafer 11 and holds it by means of wafer-holding section 25c. Hand arm 25a7 is rotated around its one end, thereby transferring semiconductor wafer 11 onto table 12. At this time, elevating pins 31 are protruding from table 12 and contact the lower surface of wafer 11, thus supporting wafer 11. Hand arm 25a7 is rotated in the opposite direction and returns to its original position, leaving the wafer on elevating pins 31. Pins 31 are then lowered, whereby placing wafer 11 on the predetermined portion of table 12.

Thereafter, the vertical position of table 12 is adjusted by operating elevating apparatus 15. This done, upper and lower halves 10a and 10b are fastened together, thus closing chamber 10 in an airtight fashion. Since the lower ends of pins 29 abut on the upper surface of table 12, gap L of 0.5 to 20 mm is provided between insulation disk 28 and wafer 11 mounted on table 12. Outlet opening 27 of nozzle 26 is axially aligned with semiconductor wafer 11. Table 12 is heated by heater 14, which in turn is controlled by temperature control device 13, whereby heating semiconductor wafer 11 to a prescribed temperature, for example, 300° C.

Next, purge gas is supplied from air-purging mechanism 20c into chamber 10. Simultaneously, chamber 10 is preliminarily evacuated by exhaust device 17, thus reducing the gap pressure within chamber to 700 to 200 Torr. The preliminary evacuation helps to promote a high-speed dispersion of ashing gas, and thus to elevate the ashing rate. If the ashing need not be performed at a high rate, or should not be performed at a high rate for some reason, this preliminary evacuation is not carried out.

Before supplying the ashing gas into chamber 10, the inside temperature of cooling chamber 10a3 is lowered to, for example, 25° C. or less by cooling cover 10a2 by means of cooling device 19. Then, oxygen is supplied from oxygen source 20a to ozone generator 20b. Ozone generator 20b hence starts generating ozone ($O_3$). The gas containing is introduced into chamber 10 at a flow rate of 50 to 500 ml/min, which is regulated by first gas-flow controller 20d. In order to promote the ashing reaction, a nitrogen oxide gas is mixed with the ozone gas. More specifically, the dinitrogen oxide gas is supplied from dinitrogen oxide source 20e to nitrogen oxide generator 20f. Within nitrogen oxide generator 20f the dinitrogen oxide gas is electrically discharged, thereby generating nitrogen oxides such as NO, NO₂, N₂O₄, ... NO$_x$. The nitrogen oxide gas thus generated is supplied at the flow rate of, for example, 40 to 1000 ml/min, which is regulated by second gas-flow controller 20g, and mixed with the ozone gas, thereby preparing an ashing gas. The ashing gas is supplied into chamber 10 through nozzle 26. It is true that nitrogen oxide gas is not indispensable, but an ashing gas containing nitrogen oxide is preferable since it helps to raise the ashing rate, unlike an ashing gas containing no nitrogen oxide.

The ashing gas ejected from nozzle 26 passes through the holes of gas-dispersing disc 30 and then is applied from outlet opening 27 onto the surface of semiconductor wafer 11. At this time, wafer 11 is heated to, for example, 300° C. Therefore, as soon as the ozone contained in the ashing gas contacts the surface of wafer 11, it is decomposed, generating many oxygen atom radicals. This oxygen atom radical undergoes the following reaction with the photoresist layer formed on wafer 11, thus ashing the layer and removing the same;

$$O_3 \rightarrow O_2 + O^* \quad (1)$$

$$C_xH_y + O^* \rightarrow CO_2 \uparrow + H_2O \uparrow \quad (2)$$

$$O_3 + O^* \rightarrow 2O_2 \quad (3)$$

where 0* is oxygen atom radical, and $C_xH_y$ is photoresist layer.

The ashing gas is applied onto the center portion of semiconductor wafer 11, and then flows in all radial directions of wafer 11. Hence, the ashing gas is uniformly applied to the entire surface of wafer 11. After the ashing, the gas is exhausted from chamber 10 by exhaust device 17. A part of the gas exhausted from chamber 10 is supplied through conduit 17 to end-point detecting device 18. End-point detecting device 18 measures the changes in the CO₂ content of the exhaust gas, by using the wavelength and amount of infrared absorption spectrum as parameters. When the CO₂ content reaches a predetermined value, device 18 outputs an electric signal to drive section 21. In response to this signal, section 21 stops the supply of the ashing gas to chamber 10.

Thereafter, when the ashing gas is completely exhausted from chamber 10, upper and lower halves 10a and 10b are separated. The ozone discharged from chamber 10 may be supplied to an ozone-decomposing device of a thermal decomposition type, thereby to prevent air pollution.

Then, elevating pins 31 are lifted, thus moving up wafer 11 a little from table 12. Wafer 11 is attracted to hand arm 25b2 by suction force. Hand arm 25b2, now holding wafer 11, is rotated, thereby transferring wafer 11 from table 12 to wafer-holding table 25b1. Wafer 11 is held in this section 25b1 for some time. Wafer-holding table 25b1 may be water-cooled, and wafer 11 may therefore be cooled while being held on table 25b1. Wafer 11 is then transported from table 25b1 to wafer-returning unit 25b3.

The ashing apparatus and the ashing method, both described above, are believed to be advantageous in the following respects.

First, semiconductor wafer 11 can be ashed without being damaged, since an oxygen atom radical is used, and no oxygen plasma is employed. Secondly, since the oxygen atom radical is generated from ozone, the ashing rate can be higher than in the case where ultraviolet rays are applied to the wafer to generate an oxygen atom radical. Thirdly, since an ashing-promoting gas, such as NOx, is mixed with the ashing gas, the ashing rate can be higher than otherwise. These advantages may be proved by the following fact.

The ashing method of this invention was applied to 32 semiconductor wafers each having a photoresist layer made of OFPR-800 and having a thickness of. 1.34 um. More precisely, oxygen gas containing 87 g/m³ of ozone was supplied at flow rate of 10 l/min, and N₂O gas was supplied at flow rate of 250 ml/min, thus forming an ashing gas. This ashing gas was applied to these wafers heated to 300° C. It was found that, on the average, 90 seconds had passed before each photoresist layer was thoroughly removed from the semiconductor wafer. Another 32 semiconductor wafers, each with the same photoresist layer formed on it, were also subjected to ashing under the same conditions, except that no NOx was mixed with the oxygen gas containing 87 g/m³ of ozone. The results were that, on the average, 180 seconds were required to completely remove each photoresist layer.

Furthermore, since the surface temperature of insulation disc 28 is substantially the same as that of the photoresist layer formed on wafer 11, the temperature of the atmosphere within chamber 10 is adjusted to a prescribed value. Hence, the ashing rate can be greatly enhanced, as will be proved by the experimental results shown in FIGS. 7 to 16.

Figure 7:
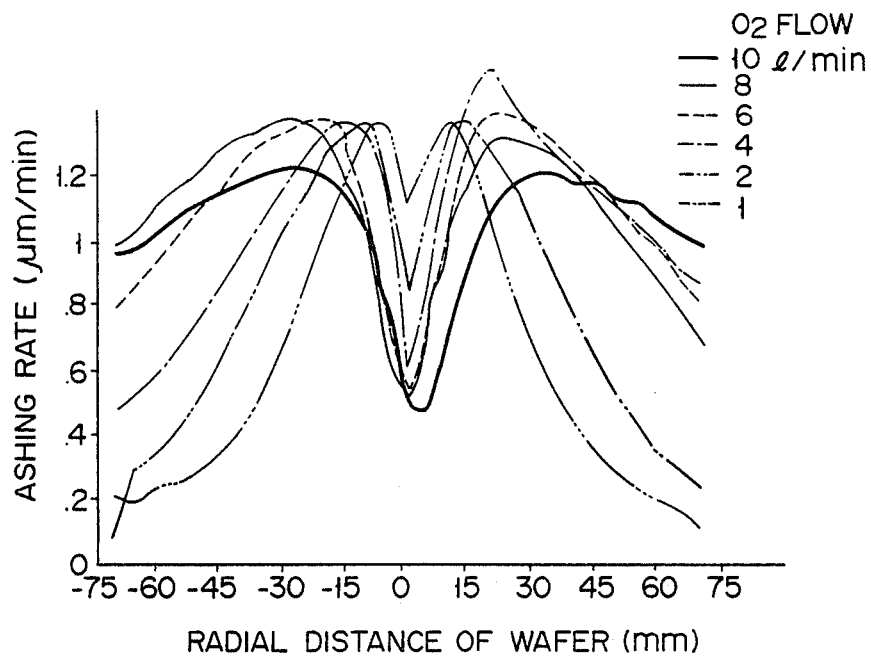
FIGS. 7 to 13 are graphs illustrating various relationships between the ashing rate and the radial distance of a wafer.

FIG. 7 shows the relationship which the ashing rate and the flow rate of the ozone-containing oxygen gas had when the O₃ concentration was 4 wt. %, the gap between wafer 11 and insulation disc 28 of heatresistance glass was 0.5 mm, the temperature of wafer 11 was 300° C., the ashing time was 30 seconds, and the oxygen gas was supplied at various flow rates of 10 l/min, 8 l/min, 6 l/min, 4 l/min, 2 l/min and 1 l/min. As FIG. 7 demonstrates, the higher the flow rate of the oxygen gas, the higher the ashing rate.

Figure 8:
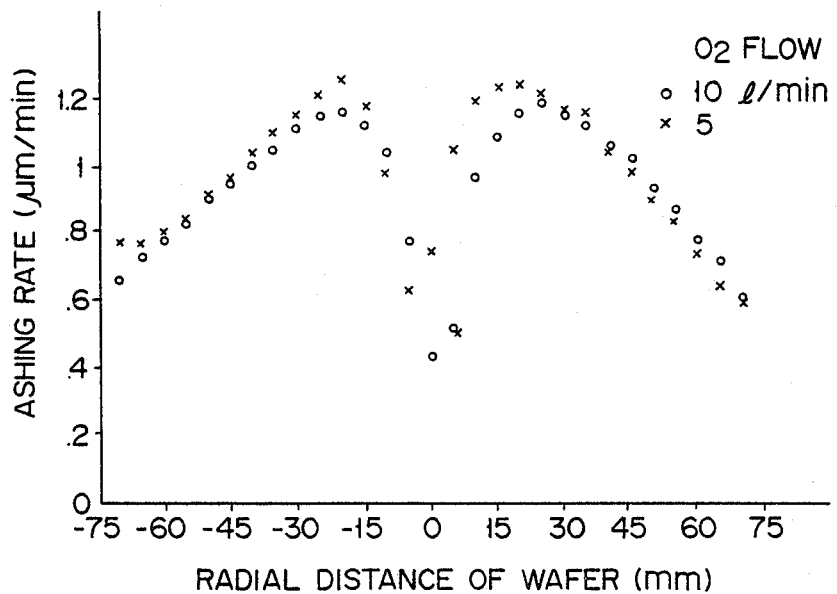

FIG. 8 represents the relationship which the ashing rate and the flow rate of the ozone-containing oxygen gas had when the O₃ concentration was 4 wt. %, the gap between wafer 11 and insulation disc 28 of heatresistant glass was 1 to 2 mm, the temperature of wafer 11 was 300° C., the ashing time was 30 seconds, and the oxygen gas was supplied at flow rates of 10 l/min and 5 l/min.

Figure 9:
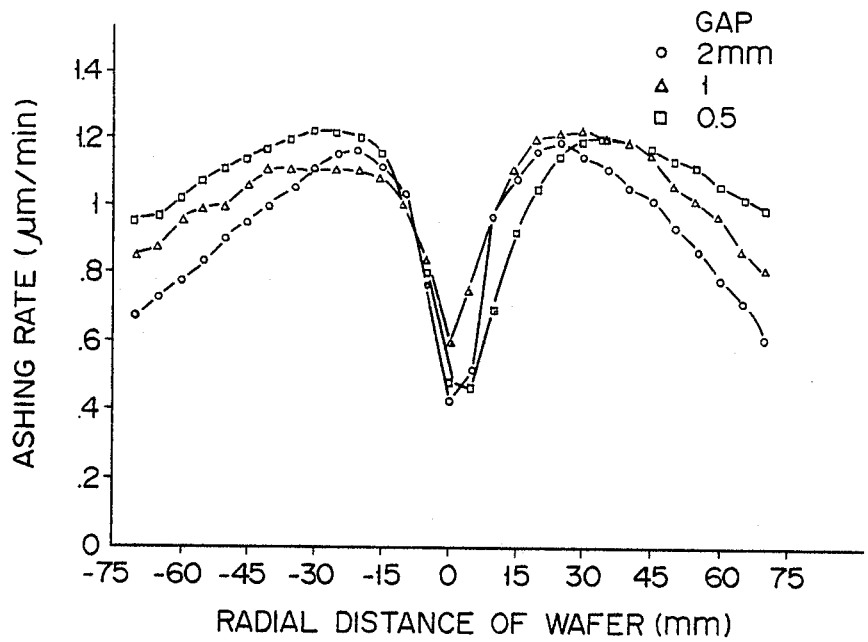

FIG. 9 is, so to speak, a combination of FIGS. 7 and 8, to demonstrate how the gap between wafer 11 and insulation disc 28 influenced the ashing rate.

Figure 10:
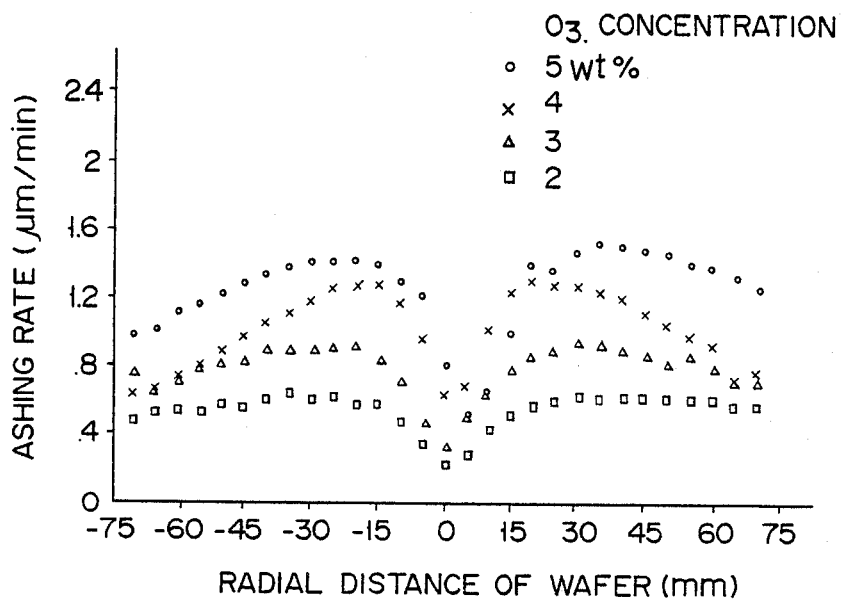

FIG. 10 shows the relationship which the ashing rate and the O₃ concentration had when the temperature of wafer 11 was 300° C., the ashing time was 30 seconds, the gap between between wafer 11 and insulation disc 28 was 0.5 mm, and the flow rate of the oxygen gas was 10 l/min. In the experiment producing these results, four oxygen gases containing 5 wt. %, 4 wt. %, 3 wt. % and 2 wt. %, respectively, were used.

Figure 11:
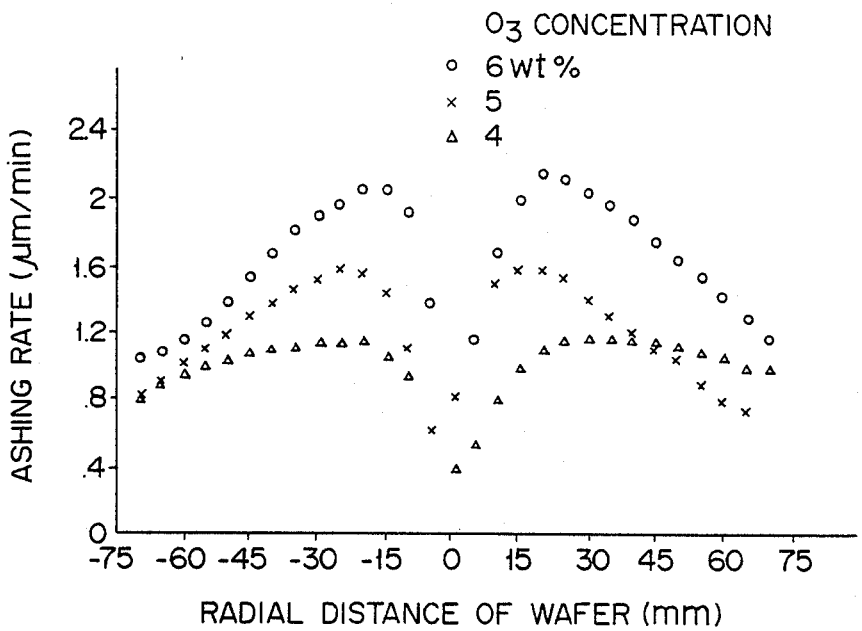

FIG. 11 shows the relationship which the ashing rate and the O₃ concentration had when the temperature of wafer 11 was 300° C., the ashing time was 30 seconds, the gap between wafer 11 and insulation disc 28 was 0.5 mm, and the flow rate of the oxygen gas was 5 l/min. In the experiment producing these results, three oxygen gases containing 6 wt. %, 5 wt. %, and 4 wt. %, respectively, were used.

As is evident from FIGS. 10 and 11, the ashing rate was proportional to the $O_3$ concentration. This trend was particularly prominent in that annular portion of the photoresist layer which was at a distance of 10 mm to 40 mm from the center of wafer 11. As FIGS. 10 and 11 reveal, the lower the $O_3$ concentration, the more uniformly the ashing was achieved over the entire surface of wafer 11.

Figure 12:
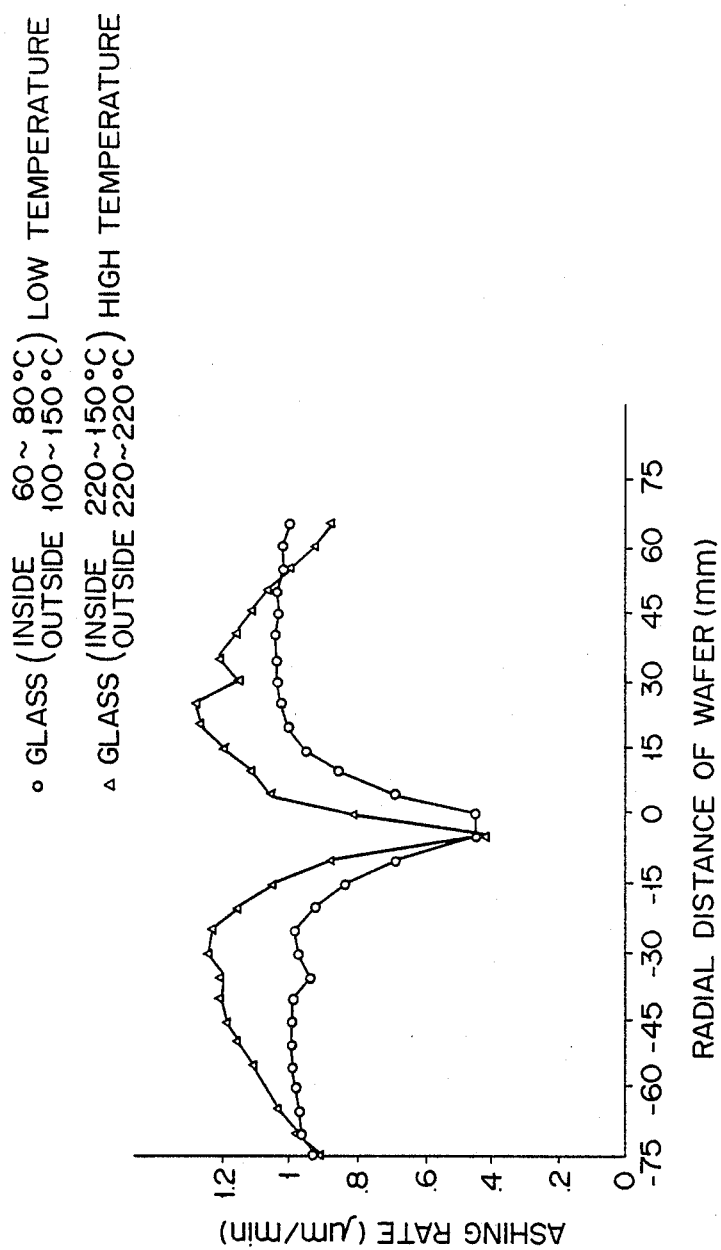
Figure 13:
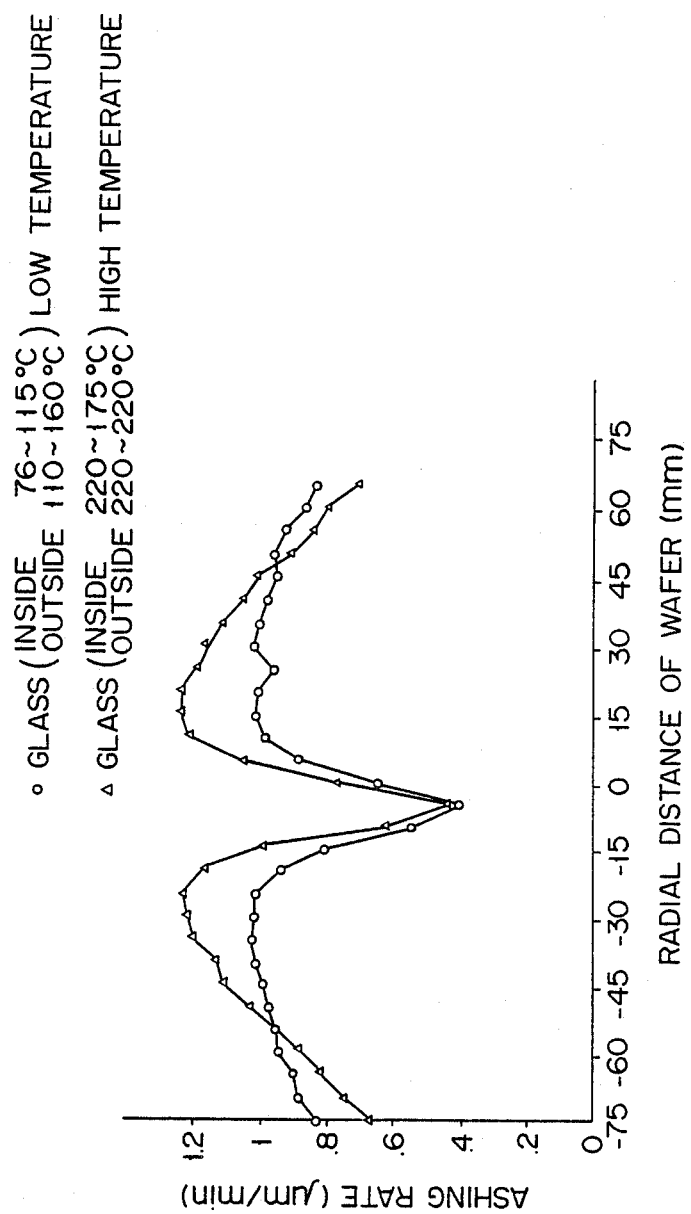

FIGS. 12 and 13 show how the ashing rate is influenced by the temperature of insulation disc 28. FIG. 12 represents the ashing rate distribution over the surface of wafer 11 when the flow rate of the oxygen gas was 10 l/min, and FIG. 13 shows the ashing rate distribution over the surface of wafer 11 when the flow rate of the oxygen gas was 5 l/min. In both experiments which produced the results shown in FIGS. 12 and 13, the flow rate of $O_3$ was 10 l/min, the $O_3$ concentration was 65 g/m$^3$ (Or 4.5 Wt. %), the temperature of wafer 11 was 300° C., and the gap between between wafer 11 and insulation disc 28 was 0.5 mm. As FIGS. 12 and 13 demonstrate, the higher the temperature of insulation disc 28, the higher the ashing rate, particularly in that portion of wafer 11 that lies within a radius of 50 mm. Almost no deposit was found on the upper surface of insulation disc 28.

Figure 14:
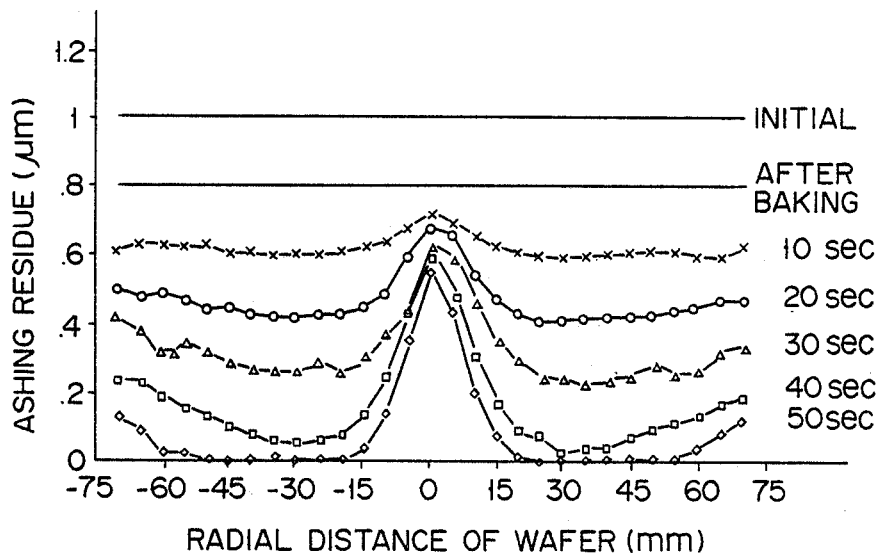
FIG. 14 is a graph illustrating the amount of ashing residue and the radial distance of a wafer.

FIG. 14 shows the relationship which the ashing time and the thickness of the residual photoresist layer had when when the flow rate of the oxygen gas was 10 l/min, the $O_3$ concentration was 4 wt. %, the temperature of wafer 11 was 300° C., and the gap between between wafer 11 and insulation disc 28 was 0.5 mm. As is evident from FIG. 14, the ashing was efficient when the ashing time was 30 seconds or more.

Figure 15:
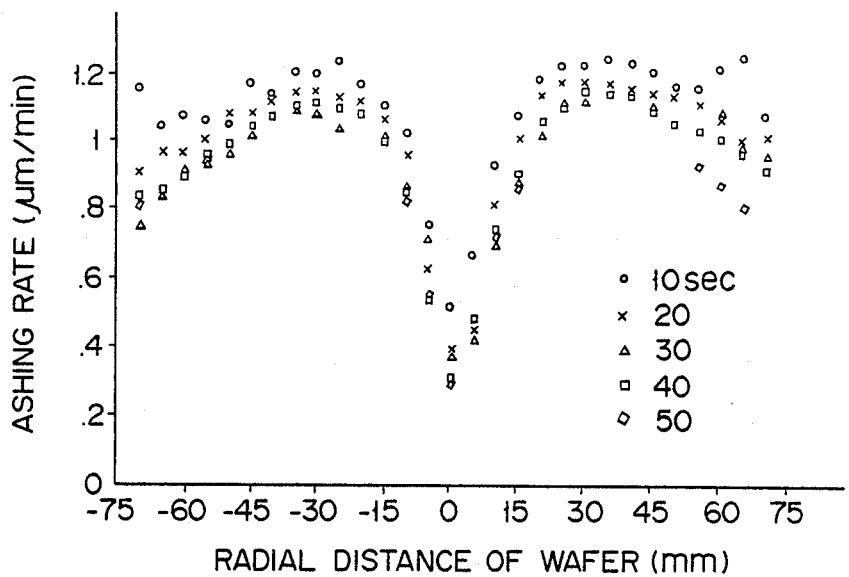
FIGS. 15 and 16 are graphs representing the relationships between the ashing rate and the radial distance of a wafer.
Figure 16:
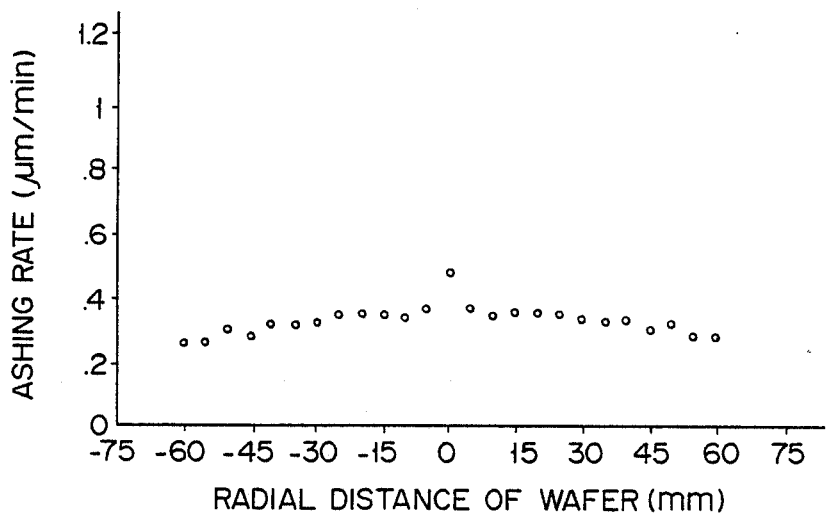

FIG. 15 represents the ashing rate distribution over the surface of wafer 11 when the ashing time was changed, while the $O_3$ concentration was 4 wt. %, the flow rate of the oxygen gas was 10 l/min, the wafer temperature was 300° C., and the gap between the wafer and the insulation disc was 0.5 mm. FIG. 16 shows the ashing rate distribution over the surface of wafer 11 when the ashing time was changed, and the ashing was performed in the same conditions, except that no insulation disc was used. As may be understood from FIGS. 15 and 16, when no insulation disc was used, the ashing rate was much reduced, but the ashing rate was uniformly distributed over the surface of the wafer. Further, it can be seen from FIG. 16, without the insulation disc, the ashing rate was noticeably high in the center portion of the water.

As has been described above, insulation disc 28 provided above semiconductor wafer 11 mounted on table 12 serves to increase the ashing rate.

Further, since the surface temperature of insulation disc 28 is rendered substantially equal to that of semiconductor wafer 11 placed on table 12. Since any portion of disc 28 is at a temperature lower than the other portions, the reaction product does not deposit on that portion. This also helps to accomplish a uniform, efficient ashing.

As has been described, one nozzle 26 is arranged above, and coaxially with, semiconductor wafer 11 mounted on table 12, and the ashing gas is applied ont wafer 11 through the holes cut in gas-dispersing disc 30, whereby the ashing gas flows in all radial directions of wafer 11. Hence, the ashing can be performed uniformly over the entire surface of semiconductor wafer 11.

In the ashing apparatus described above, one nozzle, i.e., nozzle 26 is inserted in the center hole cut in upper half 10a, and the ashing gas is applied onto wafer 11 through the holes of gas-dispersing disc 30 fitted in nozzle 26. Instead, as is shown in FIG. 17, a plurality of nozzles 26a to 26e can be inserted in the holes cut in cover 10a2, and the ashing gas can be applied onto wafer 11 through these nozzles 26a to 26e. In this case, it is preferred that gas flow controllers 20d1 to 20d3 be connected nozzles 26a to 26e, so that the ashing gas may be applied through nozzles 26a to 26e at the flow rates controlled by these controllers 20d1 to 20d3. In FIG. 17, dinitrogen oxide source 20e, nitrogen oxide generator 20f, gas flow controller 20g, end-point detecting device 18, and some other components are not shown for the sake of simplicity.

Figure 18:
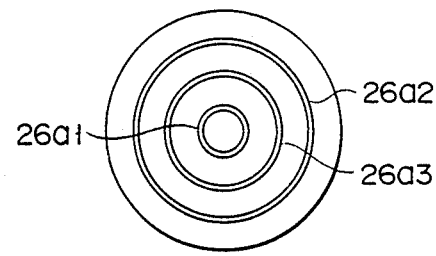
FIGS. 18 to 20 shows various nozzles which can be used in the ashing apparatus shown in FIG. 17.
Figure 19:
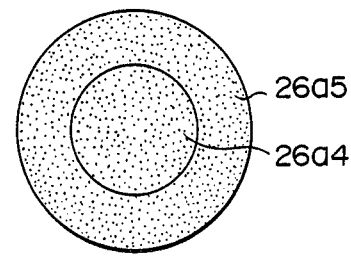
Figure 20:
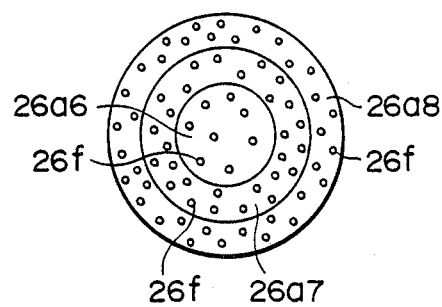

Nozzles 26a to 26e have slit-shaped outlet openings. Instead, as is shown in FIG. 18, they can be replaced by nozzles having concentric ring-shaped outlet openings 26a1, 26a2 and 26a3. Alternatively, as is shown in FIG. 19, nozzles 26a to 26e can be replaced by two concentric gas-dispersing discs 26a4 and 26a5, both mode of sintered material such as ceramics. Still further, nozzles 26a to 26e can be replaced by concentric gas-dispersing discs 26a6, 26a7, and 26a8, each having a number of small holes.

The ashing apparatus with a plurality of nozzles can perform ashing at a high and constant rate uniformly over the entire surface of semiconductor wafer 11, as is shown in FIG. 21, since both the flow rate of the ashing gas and the ozone concentration of the gas can be controlled differently for the different regions of the surface of wafer 11.

The present invention is not limited to the embodiments described above. Although table 12, with wafer 11 mounted on it, is fixed during the ashing process in the above embodiments, it can be rotated during the process, thereby to accomplish a more uniform ashing. Further, instead of processing only one wafer within chamber 10 as in each embodiment described above, a batch of semiconductor wafers can be simultaneously subjected to ashing in chamber 10. According to the invention, it is also possible to perform ashing on semiconductor wafers while they are being transported by a conveyor line. Still further, the ashing gas can be exhausted from chamber 10 through some of the holes cut in the gas-dispersing disc, while fresh ashing gas is being supplied into the chamber through the other holes of the gas-dispersing disc. In this case, a circulation of residual gas within chamber 10 can be prevented. Moreover, a catalyst can be applied to the ashing gas flowing through the supply duct, thereby to generate an oxygen atom radical, instead of heating the gas for the same purpose as is practiced in the embodiment described above. The catalyst may be a metal such as palladium, platinum, rhodium, manganese, lead, copper, nickel, vanadium or ruthenium, or a compound such as alumina, silica or carbon zeolite.

In the embodiments described above, it is the photoresist layer formed on a semiconductor wafer that is ashed and removed from the water. This does not mean that the present invention is applied only in ashing photoresist layers. The present invention can of course be applied in forming TFT circuits on the glass substrate of a liquid crystal display, and also in manufacturing printed circuit boards.

Any ozone-containing gas other than ozone-containing oxygen can be used. For example, nitrogen gas ($N_2$), argon gas (Ar), or neon gas (Ne), each containing ozone, can be used.

What is claimed is:

1. An ashing method, comprising the steps of:
   preparing a gas mixture of ozone and nitrogen oxides excited by passing an electric discharge through dinitrogen oxide;
   generating oxygen atom radicals in said gas mixture by heating said gas mixture in a reaction region above a heated substrate, said gas mixture uniformly flowing over the surface layer of the substrate and the reaction region being the zone between the surface of the substrate and a plane 0.5–20 mm high above the substrate; and
   ashing a desired portion of the surface layer of said substrate by reaction of the surface layer with said oxygen atom radicals.

2. The method of claim 1, wherein the surface temperature of the substrate ranges from 150° to 800° C.

3. The method of claim 1, further comprising the step of detecting the end point of the ashing reaction by measuring the concentration of the gas generated by the ashing reaction.

4. An ashing method, comprising the steps of:
   preparing a gas mixture of ozone and nitrogen oxides excited by passing an electric discharge through dinitrogen oxide;
   heating said gas mixture containing ozone and excited nitrogen oxides thereby generating a gas containing oxygen atom radicals;
   contacting the surface of a substrate with said gas mixture by allowing said gas containing oxygen atom radicals to flow uniformly over said substrate surface from its center to the periphery thereof in the radial direction of said substrate; and
   ashing a desired portion of the surface layer of said substrate by reaction of the surface layer with said oxygen atom radicals.

* * * * *